(12) United States Patent
Yang et al.

(10) Patent No.: US 8,487,289 B2
(45) Date of Patent: Jul. 16, 2013

(54) ELECTRICALLY ACTUATED DEVICE

(75) Inventors: Jianhua Yang, Palo Alto, CA (US); Minxian Max Zhang, Mountain View, CA (US); Gilberto Medeiros Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 118 days.

(21) Appl. No.: 12/899,210

(22) Filed: Oct. 6, 2010

(65) Prior Publication Data

US 2012/0085985 A1    Apr. 12, 2012

(51) Int. Cl.
*H01L 45/00*    (2006.01)

(52) U.S. Cl.
USPC ................. 257/3; 257/2; 257/4; 257/E45.003

(58) Field of Classification Search
USPC .......................................................... 257/3
See application file for complete search history.

(56) References Cited

U.S. PATENT DOCUMENTS

| | | | |
|---|---|---|---|
| 7,750,332 B2 * | 7/2010 | Sakamoto et al. | 257/2 |
| 7,750,386 B2 * | 7/2010 | Tian et al. | 257/296 |
| 8,058,646 B2 * | 11/2011 | Sun et al. | 257/43 |
| 8,097,902 B2 * | 1/2012 | Xi et al. | 257/154 |
| 2008/0090337 A1 * | 4/2008 | Williams | 438/133 |

FOREIGN PATENT DOCUMENTS

| | | |
|---|---|---|
| WO | WO 2010/050937 | 5/2010 |
| WO | WO 2010/074688 | 7/2010 |

* cited by examiner

*Primary Examiner* — Jerome Jackson, Jr.

(57) ABSTRACT

An electrically actuated device includes a reactive metal layer, a first electrode established in contact with the reactive metal layer, an insulating material layer established in contact with the first electrode or the reactive metal layer, an active region established on the insulating material layer, and a second electrode established on the active region. A conductive nano-channel is formed through a thickness of the insulating material layer.

17 Claims, 3 Drawing Sheets

OFF STATE        ON STATE

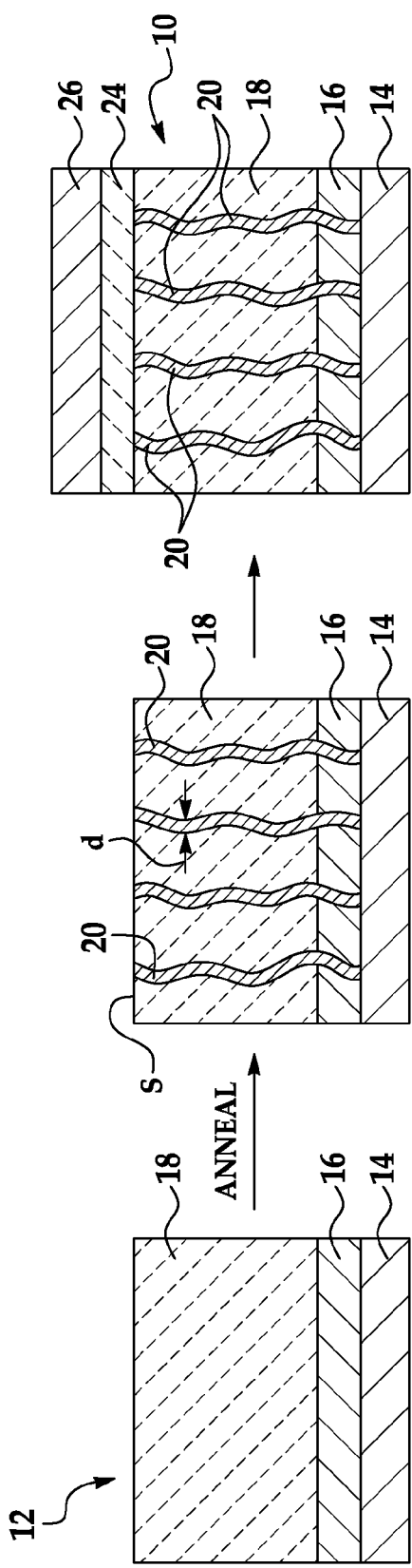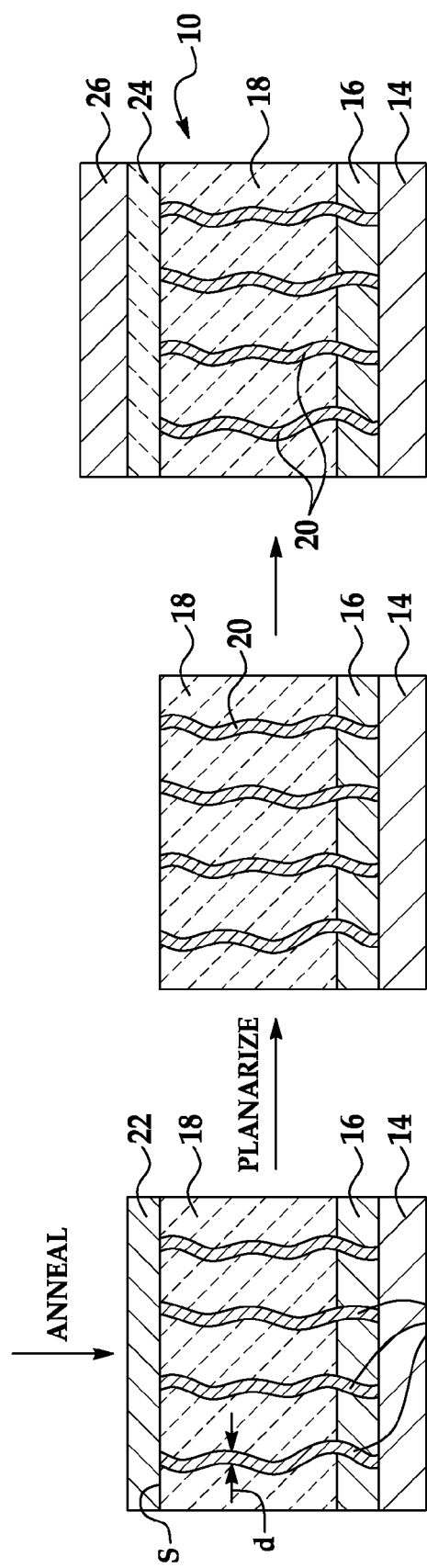

ELECTRICALLY ACTUATED DEVICE

STATEMENT REGARDING FEDERALLY SPONSORED RESEARCH OR DEVELOPMENT

This invention has been made with government support. The government has certain rights in the invention.

BACKGROUND

The present disclosure relates generally to electrically actuated devices.

Metal and insulating film based electronic components have recently been used to build electronic circuits. One example of these electronic circuits is a nanometer-scale crossed-wire or crossbar device that can be switched reversibly. The structure of some of these devices includes switching seeds that lead to the formation of conductive channels in an active region during the initial operation of the device. These devices require an electro-forming process, which involves high voltage and causes a large variance, which may damage the devices. The structure of others of these devices, which do not require an electro-forming process, includes a solid layer (e.g., $Ti_4O_7$) that acts as a source/sink of dopants for the active region. It has been found that the current of the device including the solid layer may be high even in an OFF state, due, in part to the high conductivity of the solid layer.

BRIEF DESCRIPTION OF THE DRAWINGS

Features and advantages of examples of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1C are schematic diagrams illustrating an embodiment of a method for forming an embodiment of an electrically actuated device;

FIGS. 1A and 1D through 1F are schematic diagrams illustrating another embodiment of a method for forming an embodiment of an electrically actuated device;

DETAILED DESCRIPTION

Figure 2:
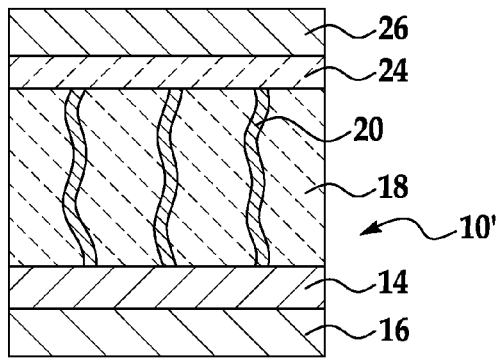
FIG. 2 is a schematic diagram depicting another embodiment of the electrically actuated device.

Embodiments of the method disclosed herein achieve the formation of conductive channels during the fabrication process so that the problematic electro-forming process can be eliminated, and devices with small background current can be obtained. As such, conductive suboxides (e.g., $Ti_4O_7$) can be formed inside the device as, for example, nanoscale channels, rather than as a solid layer across the whole device area and without the need for electro-forming. The elimination of the electro-forming step from the process may also reduce the variance from one device to the next that are formed via the method(s) disclosed herein.

Embodiments of the device disclosed herein include an active region adjacent a polycrystalline or columnar amorphous/nanocrystalline insulating region that has at least one of the conductive channels formed therein. When multiple conductive channels are formed, the conductive channels are isolated from one another because they form along grain boundaries or boundaries of columnar structures in the insulating region. The presence of discrete conductive channels within a bulk insulating region significantly reduces the background current of the device, which results in a large device resistance, for example over Mohm in the ON state. This is desirable because the operation power is reduced, and the ON/OFF ratio and block size of the memory is increased. In one embodiment of the devices disclosed herein, the ON/OFF ratio can be up to 10000. Furthermore, the size of the individual channels enables the switching current to be relatively low, e.g., less than 10 μA for a 50 nm×50 nm device, which leads to low energy circuits.

As such, embodiments of the device disclosed herein advantageously are electro-forming free and provide a desirable ON/OFF ratio and switching current level.

Referring now to FIGS. 1A through 1F, two embodiments of the method for forming an embodiment of the electrically actuated device 10 are depicted. One embodiment is shown in FIGS. 1A through 1C, and another embodiment is shown in FIGS. 1A and 1D through 1F.

As shown in FIG. 1A, the method begins by forming or otherwise providing a structure 12. The structure 12 includes a reactive metal layer 14, a first electrode 16, and an insulating material layer 18. When forming the structure 12, a conducting material is deposited on the reactive metal layer 14 to form the first electrode 16, and then an insulating material is deposited on the first electrode 16 to form an insulating material layer 18.

While not shown in FIG. 1A, the structure 12 may be formed on a substrate. The substrate may be any desirable material, including, but not limited to semiconductor materials. Some examples of specific substrate materials include silicon dioxide, silicon nitride, aluminum oxide, magnesium oxide, strontium titanate, glass, or the like.

The reactive metal layer 14 may be a preformed metal sheet, or may be deposited (e.g., on the substrate) to form a desirable layer. Any suitable technique may be used to form the reactive metal layer 14, such as, for example, sputtering, e-beam evaporation, molecular beam epitaxy, chemical vapor deposition (CVD), or atomic layer deposition (ALD). The thickness of the reactive metal layer 14 depends, at least in part, on the amount of metal that is to diffuse through the adjacent electrode 16 and on the desirable switching properties of the device 10. As one example, the thickness of reactive metal layer 14 is about 5 nanometers. In another example, the thickness ranges from about 5 nanometers to about 30 nanometers. It is to be understood that the thickness may be further varied as is desirable. Generally, the thicker the layer 14, the more metal that is available for diffusion, and the more metal that diffuses, the lower the device resistance becomes. Similarly, the thinner the layer 14, the less metal that is available for diffusion, and the less metal that diffuses, the higher the device resistance becomes.

Metals that are suitable for the reactive metal layer 14 are those that can i) diffuse through the adjacent electrode 16 during annealing, and ii) form conductive channels in the insulating material layer 14 when diffusing therethrough. Some examples of suitable metals for the reactive metal layer 14 include aluminum, cobalt, copper, gallium, gold, hafnium, iron, molybdenum, nickel, niobium, silver, strontium, tantalum, titanium, vanadium, yttrium, zinc, zirconium, and alloys of these metals.

As previously mentioned, in one embodiment, the conductive material is deposited on the reactive metal layer 14 to form the first electrode 16. The electrode 16 may be fabricated on the reactive metal layer 14 using conventional techniques, such as photolithography or electron beam lithography, or by more advanced techniques, such as imprint lithography. In one embodiment, the thickness of the electrode 16 ranges from about 5 nm to about 30 nm. The thickness may be varied, depending, at least in part, on the desirable diffusion properties and the thickness of the reactive metal layer 14. The electrode 16 may be any suitable conductive material, such as copper, gold, platinum, tungsten, etc.

Also as previously mentioned, in one embodiment, the insulating material is deposited on the first electrode 16 to form the insulating material layer 18. The insulating material is a polycrystalline material having grain boundaries, a nanocrystalline material with columnar structures, or an amorphous material with columnar structures. Some examples of insulating materials that are suitable for forming the layer 18 include titanium dioxide, silicon, polycrystalline tantalum pentoxide, zirconium oxide, hafnium oxide, yttrium oxide, aluminum oxide, aluminum nitride, magnesium oxide, manganese oxide, cobalt oxide, nickel oxide, iron oxide, vanadium oxide, tungsten oxide, copper oxide, zinc oxide, gallium oxide, strontium titanate, indium tin oxide, and gallium nitride. It is to be understood that each of these material may be selected to have the desired structure (i.e., polycrystalline, nanocrystalline with columnar structures, or amorphous with columnar structures). It is to be further understood that compounds of the previously listed materials may also be suitable, for example, $Ti_{0.5}Hf_{0.5}O_2$ may be used. These materials may be deposited via any suitable technique, some examples of which include sputtering, atomic layer deposition (ALD), chemical vapor deposition (CVD), evaporation, spin coating, etc.

After the structure 12 shown in FIG. 1A is obtained, the structure is annealed. The annealing temperature and time is sufficient to cause some or all of the metal in the reactive metal layer 14 to diffuse through the adjacent electrode 16 and through the insulating material layer 18. The time and temperature for annealing depends, at least in part, upon the material system (i.e., materials for the various layers 14, 16, 18) used, on the amount of metal to be diffused, and the thickness of the layers 16, 18. In an embodiment, the annealing temperature ranges from about 150° C. to about 550° C., and the annealing time ranges from about 15 minutes to about 2 hours. As one example, when titanium is selected for the reactive metal layer 14, platinum is selected for the electrode 16, and polycrystalline titanium dioxide is selected for the insulating material layer 18, the temperature for annealing ranges from 290° C. to about 310° C. and time for annealing is about 1 hour. In one embodiment, annealing is accomplished in any inert gas environment. In another embodiment, annealing is accomplished in air or in pure oxygen.

Diffusion of the metal takes place through the grain boundaries in the electrode 16 and in the polycrystalline insulating material layer 18, or through the grain boundaries in the electrode 16 and through the columnar structures in the nanocrystalline or amorphous insulating material layer 18. The grain boundaries or columnar structures limit and mediate the thermal diffusion of the metal. This causes conductive channels 20 to be formed that have a diameter d that is about 20 nm or less. In one embodiment, the diameter is about 1 nm or less. As such, the grain boundaries of the electrode 16 and the grain boundaries or columnar structures of the insulating material layer 18 may be selected to achieve desirable diffusion.

The metal in the reactive metal layer 14 and the insulating material in the insulating material layer 18 are both selected such that, upon chemical reaction or some other interaction between the metal and the insulating material (as a result of metal diffusion), the conductive channels 20 are formed in the insulating material layer 18. The reaction or interaction between the diffused metal and the insulating material forms charged defects (e.g., charged vacancies, anions, or cations) in the insulating material layer 18 at localized regions dictated by the grain boundaries. In an embodiment, the conductive channels 20 are an insulating material phase that is rich with charged vacancies, anions, or cations. In one example, when the insulating material layer 18 is formed of polycrystalline titanium dioxide, the metal selected may be titanium, which creates conductive channels 20 of a material phase rich in vacancies (e.g., $TiO_{2-x}$, where $0<x<2$) in the titanium dioxide.

The following table provides some examples of suitable insulating materials, metals, and the resulting conductive channels 20.

TABLE 1

| Insulating Material | Diffused Metal | Conductive Channel |
|---|---|---|
| $TiO_2$ | Ti | $TiO_{2-x}$ containing oxygen vacancies |
| $ZrO_2$ | Zr | $ZrO_{2-x}$ containing oxygen vacancies |
| $HfO_2$ | Hf | $HfO_{2-x}$ containing oxygen vacancies |
| $SrTiO_3$ | Sr—Ti alloy | $SrTiO_{3-x}$ containing oxygen vacancies |
| GaN | Ga | $GaN_{1-x}$ containing nitrogen vacancies |
| Si | Cu | Copper cations |

As shown in FIG. 1B, annealing may be accomplished until the metal diffuses through the entire thickness of the insulating material layer 18. The diffusion of the metal may be monitored by some surface sensitive chemical analysis tool, such as x-ray photoelectron spectroscopy, Auger electron spectroscopy, or the like. As shown in FIG. 1D, annealing may also be accomplished until the metal diffuses through the entire thickness of the insulating material layer 18 and forms a metal layer 22 on the surface S of the insulating material layer 18.

Referring specifically to FIGS. 1B and 1C, when annealing is stopped before the metal diffuses to the surface S of the insulating material layer 18, the method continues with the deposition of a material that will form the active region 24 (as shown in FIG. 1C). The active region 24 is a thin film (e.g., ranging from about 0.5 nm to about 5 nm, or in another embodiment from about 2 nm to about 4 nm) of a material that is electrically semiconducting or nominally electrically insulating and is a weak ionic conductor. It is to be understood that the definition of weak ionic conductor depends upon the application for which the device 10 is designed. The mobility and the diffusion constant for a species in a lattice are directly proportional to one another, via the "Einstein relation". Thus, if the mobility of an ionized species in a lattice is very high, so is the diffusion constant. In general, it is desired for a device 10 to stay in a particular state, ON or OFF, for an amount of time that may range from a fraction of a second to years, depending on the application. Thus, the diffusion constant for such a device 10 is, in an embodiment, low enough to ensure the desired level of stability, to avoid inadvertently turning the device 10 from ON to OFF or vice versa via ionized species diffusion, rather than by intentionally setting the state of the device 10 with a voltage pulse. Therefore, a "weak ionic conductor" is one in which the ion mobility, and thus the diffusion constant, is small enough to ensure the stability of the ON or OFF state of the device 10 for as long as necessary under the desired conditions (e.g., the device 10 does not change state because of diffusion of the defects).

Some examples of suitable materials for the active region 24 include oxides, sulfides, selenides, nitrides, phosphides, arsenides, chlorides, and bromides of silicon, transition metals, rare earth metals, or alkaline earth metals. Specific examples of suitable active region 24 materials include aluminum oxide, aluminum nitride, hafnium oxide, gallium nitride, tantalum pentoxide, titanium dioxide, and zirconium oxide. In one embodiment, the material selected for the active region 24 is the same as the material selected for the insulating material layer 18. In another embodiment, the materials selected for the region 24 and layer 18 are different.

The material for the active region 24 may be deposited via conventional physical and chemical techniques, including evaporation from a heated source, such as a filament or a Knudsen cell, electron beam (i.e., e-beam) evaporation from a crucible, sputtering from a target, other forms of evaporation, chemical vapor deposition (CVD), molecular beam deposition, atomic layer deposition, or various other forms of chemical vapor or beam growth from reactive precursors.

After the active region 24 is deposited, a second electrode 26 is deposited on the active region 24. The second electrode 14 may be the same or a different material than the first electrode 16, and may be established via the same or a different technique than that used to establish the first electrode 16. In one example, the second electrode 26 is evaporated with an electron beam evaporator. The thickness of the second electrode 26 also generally ranges from about 5 nanometers to as many as hundreds of nanometers.

Referring now to FIGS. 1D through 1F, when annealing continues such that the metal diffuses through to the surface S of the insulating material layer 18, a metal layer 22 may be formed on the surface S. Prior to depositing the active region 24, this metal layer 22 is removed. Any suitable removal process may be used to remove the metal layer 22 and planarize the surface S so that the conductive channels 20 are exposed. In one embodiment, an etching process is used. The etching process selected will depend, at least in part, upon the metal in the metal layer 22. Some examples of suitable etching processes include wet etching, dry etching (e.g., reactive ion etching (RIE), ion-milling (e.g., with argon), or the like), or chemical mechanical polishing (CMP). FIG. 1E illustrates the structure after the metal layer 22 is removed and the surface S is planarized using chemical mechanical polishing.

The method then continues with the deposition of the material that will form the active region 24 and the material that will form the second electrode 26 (as shown in FIG. 1F). The materials and processes previously described in reference to FIG. 1C may be used to form the active region 24 and the second electrode 26.

Referring now to FIG. 2, it is to be understood that in another embodiment of the device 10', the first electrode 16 may be formed or supplied, and the reactive metal layer 14 may be deposited thereon. In this embodiment, the insulating material layer 18 is formed on and in direct contact with the reactive metal layer 14. The channels 20 may be formed as described herein using annealing, except that the diffusing metal will not have to travel through the electrode 16. The active region 24 and second electrode 26 may be deposited as previously described.

Figure 3:
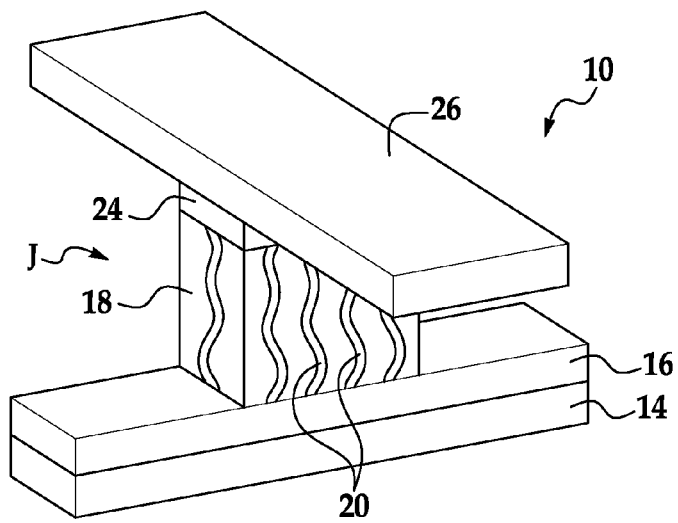
FIG. 3 is a semi-schematic perspective view of an embodiment of an electrically actuated device.

As shown in FIG. 3, in one embodiment of the device 10 (similar to the device shown in FIGS. 1C and 1F), the second electrode 26 is positioned perpendicular to the first electrode 16. More generally, the second electrode 26 is positioned at any non-zero angle with respect to the first electrode 16. The area between the crossing electrodes 16, 26 is a junction J that has the active region 24 and the insulating material layer 18 with conductive channels 20 positioned therein. Switching can occur at the junction J.

Figure 4A:
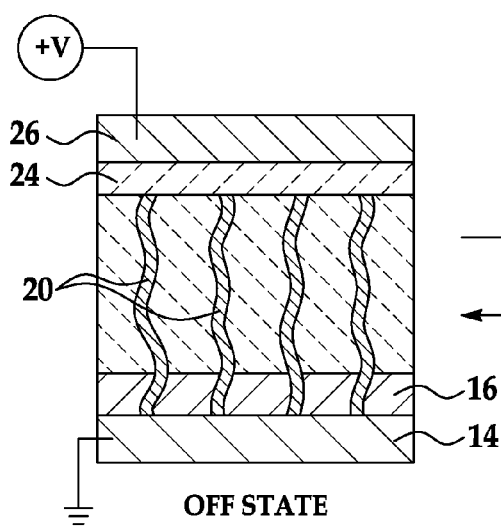
FIGS. 4A and 4B are schematic views of an embodiment of an electrically actuated device in an OFF state (FIG. 4A) and in an ON state (FIG. 4B)
Figure 4B:
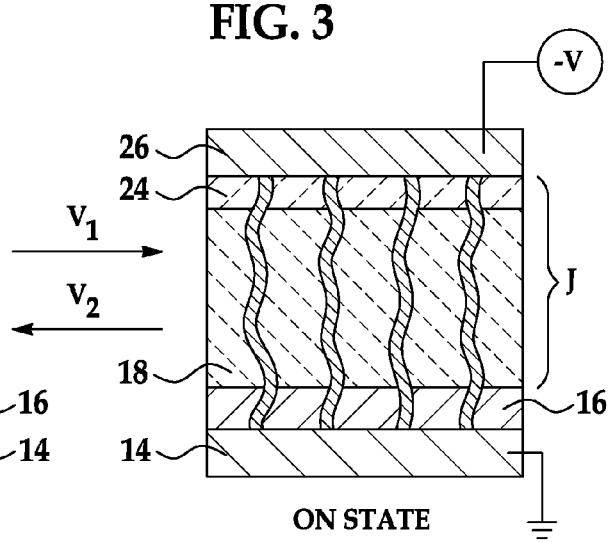

The basic mode of operation of the device 10 is shown in FIGS. 4A and 4B. A voltage ($V_1$) is applied across the device 10. The voltage is large enough to generate an electric field which exceeds some threshold for enabling the growth of the conductive channels 20 into the active region 24. Since the conductive channels 20 include some defect (i.e., mobile dopant), a sufficient electric field will cause the defects to be transported within the active region 24 via ionic transport. The conductive channels 20 grow into the active region 24. The growth of the conductive channels 20 through the active region 24 changes the electrical conductivity of the active region 24 from no or low conductivity (i.e., an undoped semiconductor or insulator—switch-OFF configuration) to a higher conductivity (i.e., doped where channels 20 form to provide a higher conductivity—switch-ON configuration) (see FIG. 4B). Depending on the voltage ($V_1$) that is applied, less than all of the conductive channels 20 may grow/extend into the active region 24. In one example, a negative bias voltage is applied across the junction J that exceeds the threshold of drift for positively charged defects (e.g., oxygen vacancies, cations) in the conductive channels 20. This causes at least a portion of the active region 24 (where the conductive channels 20 grow) to acquire a higher conductivity.

An opposite voltage ($V_2$) may be applied across the device 10 to switch the device 10 from high electrical conductivity to no or low conductivity (switch-ON to switch-OFF). When the opposite voltage is applied, the insulating properties of the active region 24 are recovered, and the conductive channels 20 retract into the insulating material layer 18. The electrical connection between the second electrode 26 and the conductive channels 20 is broken, and the device 10 is in an OFF state (see FIG. 4A). In the example given above, a positive bias voltage is applied across the junction J that exceeds the threshold of drift for the positively charged defects, which causes the channels 20 to shrink back into the insulating material layer 18 and the active region 24 again becomes neutral. As such, the reconfiguration of the conductive channels 20 under a suitable electric field changes the electrical transport behavior of the junction J.

Figure 5:
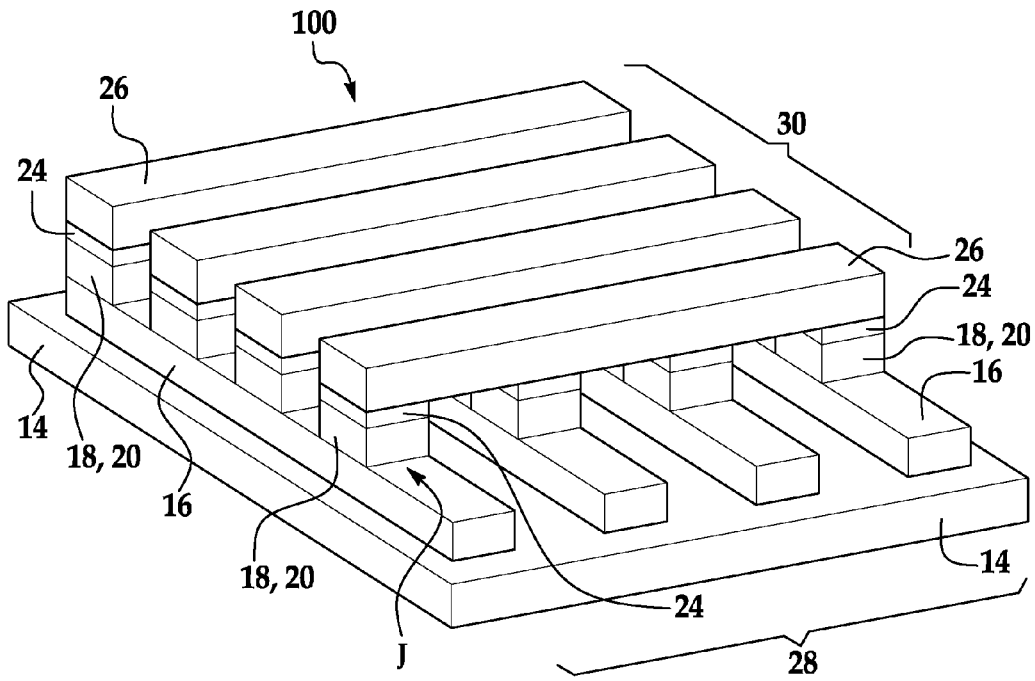
FIG. 5 is a semi-schematic perspective view of an embodiment of a crossbar array including embodiments of the electrically actuated device.

Referring now to FIG. 5, embodiments of the electrically actuated device 10 (or 10') may be implemented in a crossbar array 100. A first layer 28 of approximately parallel electrodes 16 is overlain by a second layer 30 of approximately parallel electrodes 26. The electrodes 26 in the second layer 30 are roughly perpendicular, in orientation, to the electrodes 16 of the first layer 28. It is to be understood, however, that the orientation angle between the electrodes 16, 26 of the layers 28, 30 may vary. The two layers 28, 30 of electrodes 16, 26 form a lattice, or crossbar. Each electrode 26 of the second layer 30 overlies all of the electrodes 16 of the first layer 28, and comes into close contact with each electrode 16 of the first layer 28 at intersections that represent the closest contact between two electrodes 16, 26. The switch junction J is shown disposed between electrodes 16, 26. A switch junction J (including insulating material layer 18 with conductive channels 20 and active region 24) is formed at each intersection of an electrode 16 with an electrode 26. Such crossbars 100 may be fabricated from micron-, submicron- or nanoscale-electrodes, depending on the application.

Although individual electrodes 16, 26 in the figures are shown with square or rectangular cross-sections, electrodes 16, 26 may also have circular, elliptical, or more complex cross-sections. The electrodes 16, 26 may also have many different widths or diameters and aspect ratios or eccentricities.

As is well known, the switches disclosed herein may be used as the basis for memories (e.g., the storage of a bit of information, 1 or 0), as either a closed or open switch in a cross-point memory, for configuration bits in a logic circuit that resembles a Field Programmable Gate Array, or as the basis for a wired-logic Programmable Logic Array. These switches also find uses in a wide variety of other applications.

To further illustrate embodiment(s) of the present disclosure, the following example and comparative example are given. It is to be understood that this example is provided for illustrative purposes and is not to be construed as limiting the scope of the disclosed embodiment(s).

EXAMPLE AND COMPARATIVE EXAMPLE

A comparison of the annealing behaviors in $O_2$ of two junctions, one with a titanium metal layer (example) and one without a titanium metal layer (comparative example) was performed. This comparison verified the working mechanism of the metal layer.

Example Device: this device was a crossbar including a titanium metal layer (5 nm thickness), a first platinum electrode (15 nm thickness) deposited on the titanium metal layer, a titanium oxide ($TiO_2$) sputter layer deposited on the first platinum electrode, and a second platinum electrode (30 nm thickness) deposited on the $TiO_2$ layer and positioned perpendicular to the first platinum electrode.

Comparative Example Device: this device was a crossbar including a first platinum electrode (15 nm thickness), a titanium oxide ($TiO_2$) layer sputter deposited on the first platinum electrode, and a second platinum electrode (30 nm thickness) deposited on the $TiO_2$ layer and positioned perpendicular to the first platinum electrode.

Figure 6:
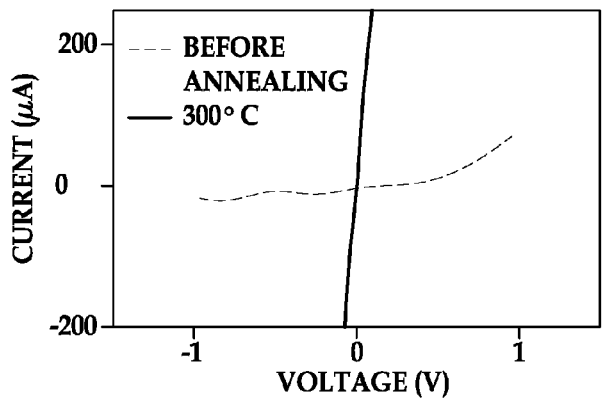
FIG. 6 is a current versus voltage curve for an embodiment of the device disclosed herein illustrating the effect of annealing.
Figure 7:
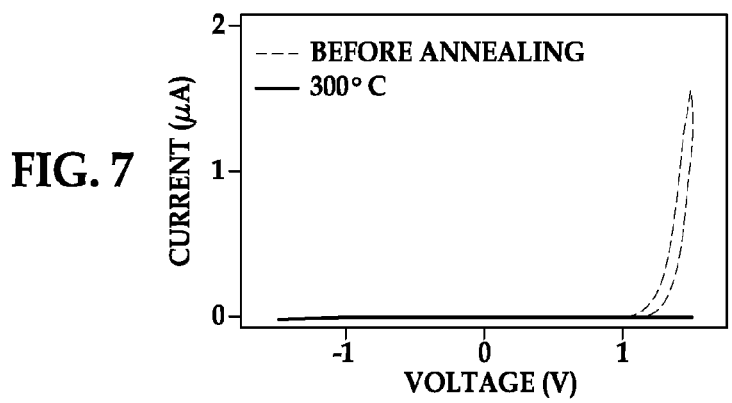
FIG. 7 is a current versus voltage curve for a comparative device illustrating the effect of annealing.

Current vs. voltage (I-V) curves (see FIGS. 6 and 7) were generated before and after each of the example device and the comparative example device were exposed to annealing at 300° C. in pure $O_2$ for 1 hour. As illustrated in FIG. 6, the example device became very conductive after annealing. This is indicative of the formation of conductive channels throughout the $TiO_2$ layer. As illustrated in FIG. 7, the comparative example device became much more resistive after annealing.

It is to be understood that the ranges provided herein include the stated range and any value or sub-range within the stated range. For example, a range from about 0.5 nm to about 5 nm should be interpreted to include not only the explicitly recited limits of about 0.5 nm to about 5 nm, but also to include individual values, such as 2 nm, 3 nm, 4 nm, etc., and sub-ranges, such as about 1 nm to about 3 nm, about 2 nm to about 4 nm, etc. Furthermore, when "about" is utilized to describe a value, this is meant to encompass minor variations (up to +/−10%) from the stated value.

While several embodiments have been described in detail, it will be apparent to those skilled in the art that the disclosed embodiments may be modified. Therefore, the foregoing description is to be considered non-limiting.

What is claimed is:

1. An electrically actuated device, comprising:
   a reactive metal layer;
   a first electrode established in contact with the reactive metal layer;
   an insulating material layer established as a continuous layer in contact with the first electrode or the reactive metal layer;
   a conductive nano-channel formed through a thickness of the insulating material layer, the conductive nano-channel including charged vacancies or a material phase rich with charged vacancies formed from a reaction or interaction between metal diffused from the reactive metal layer and the insulating material;
   an active region established on the insulating material layer and in contact with the conductive nano-channel, the active region including a material that enables the conductive nano-channel to be extended therein during an ON state of the device; and
   a second electrode established on the active region.

2. The electrically actuated device as defined in claim 1 wherein the reactive metal layer is chosen from aluminum, cobalt, copper, gallium, gold, hafnium, iron, molybdenum, nickel, niobium, silver, strontium, tantalum, titanium, vanadium, yttrium, zinc, zirconium, and alloys of these metals.

3. The electrically actuated device as defined in claim 1 wherein the insulating material layer is formed of a material chosen from titanium dioxide, tantalum pentoxide, zirconium oxide, hafnium oxide, yttrium oxide, aluminum oxide, aluminum nitride, magnesium oxide, manganese oxide, cobalt oxide, nickel oxide, iron oxide, vanadium oxide, tungsten oxide, copper oxide, zinc oxide, gallium oxide, strontium titanate, indium tin oxide, and gallium nitride, and wherein the material is polycrystalline, nanocrystalline with columnar structures, or amorphous with columnar structures.

4. The electrically actuated device as defined in claim 1 wherein the active region has a thickness ranging from about 0.5 nm to about 20 nm.

5. The electrically actuated device as defined in claim 1 wherein a diameter of the conductive nano-channel is 30 nm or less.

6. The electrically actuated device as defined in claim 1 wherein the first electrode is positioned at a non-zero angle relative to the second electrode.

7. An electrically actuated device, comprising:
   a titanium metal layer;
   a first electrode established on the titanium metal layer;
   a continuous titanium dioxide layer established on the first electrode;
   a $TiO_{2-x}$ conductive nano-channel, where $0<x<2$, formed through a thickness of the titanium dioxide layer at a localized region dictated by a grain boundary of the titanium dioxide layer, the $TiO_{2-x}$ being a material phase rich with charged vacancies formed from a reaction or interaction between titanium metal diffused from the titanium metal layer and the titanium dioxide material;
   a second titanium dioxide layer having a thickness ranging from about 0.5 nm to about 5 nm established i) on the titanium dioxide layer having the $TiO_{2-x}$ conductive nano-channels formed therein and ii) in contact with the $TiO_{2-x}$ conductive nano-channels; and
   a second electrode established on the second titanium dioxide layer.

8. The electrically actuated device as defined in claim 7 wherein the first electrode is positioned at a non-zero angle relative to the second electrode, and wherein the titanium dioxide layer and the second titanium dioxide layer are positioned in a junction between the first and second electrodes.

9. A method for making an electrically actuated device, comprising:
forming a structure including:
a first electrode;
a reactive metal layer in contact with the first electrode; and
a continuous insulating material layer in contact with either the first electrode or the reactive metal layer;
annealing the structure, thereby diffusing metal from the reactive metal layer through a thickness of the insulating material layer, the diffused metal reacting or interacting with the insulating material to form conductive nano-channels in the insulating material layer, the conductive nano-channels including charged vacancies or a material phase rich with charged vacancies;
after annealing, then depositing an active region on the insulating material layer containing the conductive nano-channels, the active region including a material that enables the conductive nano-channels to be extended therein during an ON state of the device; and
depositing a second electrode on the active region.

10. The method as defined in claim 9 wherein forming the structure includes:
depositing the first electrode on the reactive metal layer; and
depositing the insulating material layer on the first electrode;
wherein during annealing, the metal diffuses through the first electrode and through the thickness of the insulating material layer.

11. The method as defined in claim 9 wherein forming the structure includes:
depositing the reactive metal layer on the first electrode; and
depositing the insulating material layer on the reactive metal layer.

12. The method as defined in claim 9 wherein during annealing the metal diffuses to a surface of the insulating material layer, and wherein prior to depositing the active region, the method further comprises etching the surface of the insulating material layer to remove the diffused metal therefrom and to form a planar surface.

13. The method as defined in claim 9, further comprising controlling annealing such that the conductive nano-channel is planar with a surface of the insulating material layer.

14. The method as defined in claim 9 wherein the active region is deposited to a thickness ranging from about 0.5 nm to about 20 nm.

15. The method as defined in claim 9, further comprising selecting a temperature for annealing based upon materials selected for the reactive metal layer and the insulating material layer.

16. The method as defined in claim 15 wherein the reactive metal layer is titanium, the insulating material layer is titanium dioxide, and wherein the temperature for annealing ranges from about 290° C. to about 310° C.

17. The method as defined in claim 12 wherein the method is an electro-forming free process.

* * * * *

UNITED STATES PATENT AND TRADEMARK OFFICE
CERTIFICATE OF CORRECTION

| | |
|---|---|
| PATENT NO. | : 8,487,289 B2 |
| APPLICATION NO. | : 12/899210 |
| DATED | : July 16, 2013 |
| INVENTOR(S) | : Jianhua Yang et al. |

It is certified that error appears in the above-identified patent and that said Letters Patent is hereby corrected as shown below:

In the Claims:

In column 10, line 28, in Claim 17, delete "claim 12" and insert -- claim 9 --, therefor.

Signed and Sealed this
Twenty-sixth Day of November, 2013

Margaret A. Focarino
*Commissioner for Patents of the United States Patent and Trademark Office*